(12) United States Patent
Hashimoto (10) Patent No.: US 8,890,270 B2
(45) Date of Patent: Nov. 18, 2014

(54) PHOTOELECTRIC CONVERSION DEVICE AND METHOD FOR MANUFACTURING THE PHOTOELECTRIC CONVERSION DEVICE

(75) Inventor: Yukari Hashimoto, Omihachiman (JP)

(73) Assignee: KYOCERA Corporation, Kyoto (JP)

( * ) Notice: Subject to any disclaimer, the term of this patent is extended or adjusted under 35 U.S.C. 154(b) by 157 days.

(21) Appl. No.: 13/521,843

(22) PCT Filed: Jan. 28, 2011

(86) PCT No.: PCT/JP2011/051713
§ 371 (c)(1),
(2), (4) Date: Aug. 15, 2012

(87) PCT Pub. No.: WO2011/093431
PCT Pub. Date: Aug. 4, 2011

(65) Prior Publication Data
US 2012/0326258 A1  Dec. 27, 2012

(30) Foreign Application Priority Data

Jan. 29, 2010  (JP) ................ 2010-017726

(51) Int. Cl.
*H01L 31/0203* (2014.01)
*H01L 31/0224* (2006.01)
*H01L 31/032* (2006.01)
*H01L 27/142* (2014.01)

(52) U.S. Cl.
CPC .......... *H01L 31/0322* (2013.01); *Y02E 10/541* (2013.01); *H01L 31/022433* (2013.01); *H01L 27/1425* (2013.01)
USPC ................... 257/434; 257/E31.027

(58) Field of Classification Search
CPC ................................ H01L 27/1425
USPC ............ 257/444, E27.123, E27.124, E31.027
See application file for complete search history.

(56) References Cited

U.S. PATENT DOCUMENTS 5,641,974 A * 6/1997 den Boer et al. ............... 257/59
2009/0191663 A1 7/2009 Lechner et al.

FOREIGN PATENT DOCUMENTS

| JP | H10-229208 A | 8/1998 |
|---|---|---|
| JP | 2000-252490 A | 9/2000 |
| JP | 2002-043605 A | 2/2002 |
| JP | 2002-141526 A | 5/2002 |
| JP | 2002-373995 A | 12/2002 |
| JP | 2006-054254 A | 2/2006 |
| JP | 2009-177186 A | 8/2009 |

OTHER PUBLICATIONS

International Preliminary Report on Patentability issued for International Application No. PCT/JP2011/051713.

* cited by examiner

*Primary Examiner* — Chandra Chaudhari
(74) *Attorney, Agent, or Firm* — Procopio, Cory, Hargreaves & Savitch LLP (57) ABSTRACT

It is aimed to provide a photoelectric conversion device having high reliability by reducing cracks occurring in a photoelectric conversion layer. Included is a laminate in which a substrate, a pair of electrodes located on the substrate with a gap therebetween, and a photoelectric conversion layer located in the gap and on the pair of electrodes are laminated, wherein each of the pair of electrodes includes a linear portion extending along the gap and a first projecting portion including a curved tip surface projecting from the linear portion toward the gap, the linear portion and the first projecting portion being alternately arranged along the gap.

9 Claims, 9 Drawing Sheets

FIG. 5A
PLAN VIEW

FIG. 5B
SIDE CROSS-SECTIONAL VIEW

FIG. 6A
PLAN VIEW

FIG. 6B
SIDE CROSS-SECTIONAL VIEW

FIG. 9A
PLAN VIEW

FIG. 9B
SIDE CROSS-SECTIONAL VIEW

PHOTOELECTRIC CONVERSION DEVICE AND METHOD FOR MANUFACTURING THE PHOTOELECTRIC CONVERSION DEVICE

TECHNICAL FIELD

The present invention relates to a photoelectric conversion device including a photoelectric conversion layer comprised of a chalcopyrite-based compound and a method for manufacturing the photoelectric conversion device.

BACKGROUND ART

Examples of photoelectric conversion devices used for photovoltaic power generation and the like include chalcopyrite-based photoelectric conversion devices such as copper indium selenide type (CIS type) and copper indium gallium selenide type (CIGS type) ones.

The chalcopyrite-based photoelectric conversion device typically includes a photoelectric conversion layer comprised of a chalcopyrite-based compound such as copper indium diselenide as a light-absorbing layer and a compound semiconductor comprised of cadmium sulfide or the like as a buffer layer.

An example of the method for manufacturing a CIGS cell being one of chalcopyrite-based photoelectric conversion devices is as follows. First, a metal thin film comprised of molybdenum or the like is formed on a glass substrate to form a back electrode, and then, a separating groove for separating the back electrode in strip shapes is formed. Then, a CIGS layer serving as a photoelectric conversion layer and a buffer layer are formed on the substrate and the back electrode, and subsequently, a separating groove for separating the buffer layer and the CIGS layer is formed at a position proximate to the separating groove of the back electrode. Then, an electrode comprised of a transparent conductive film is produced on the buffer layer, and a grid electrode is printed and fired thereon. After that, a separating groove for separating the electrode, the buffer layer, and the CIGS layer is formed, to thereby form CIGS cells (for example, see Patent Document 1: Japanese Patent Application Laid-Open No. 2002-373995).

The separating groove of the back electrode on the substrate as described above is typically formed by laser processing (for example, see Patent Document 2: Japanese Patent Application Laid-Open No. 2002-43605).

SUMMARY OF THE INVENTION

Figure 7A:
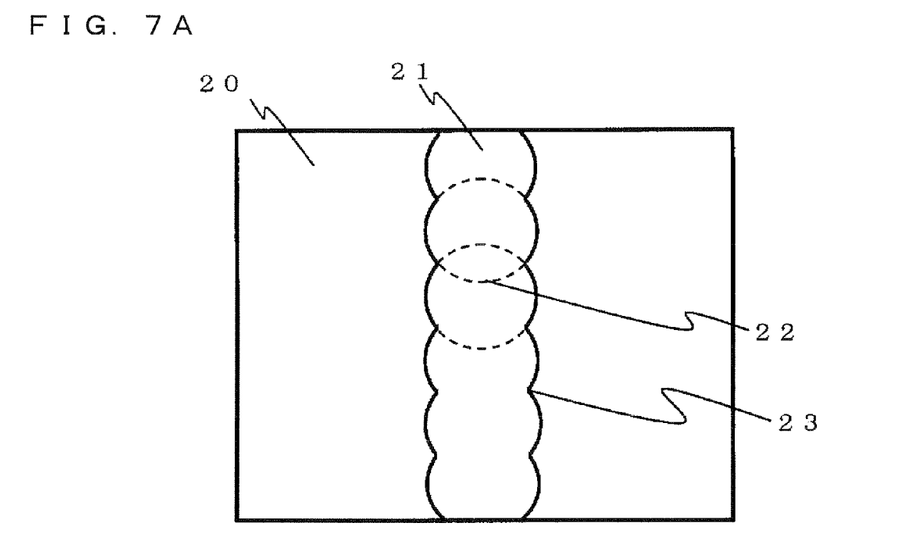
FIG. 7A is a plan view of the separating groove formed in the back electrode.
Figure 7B:
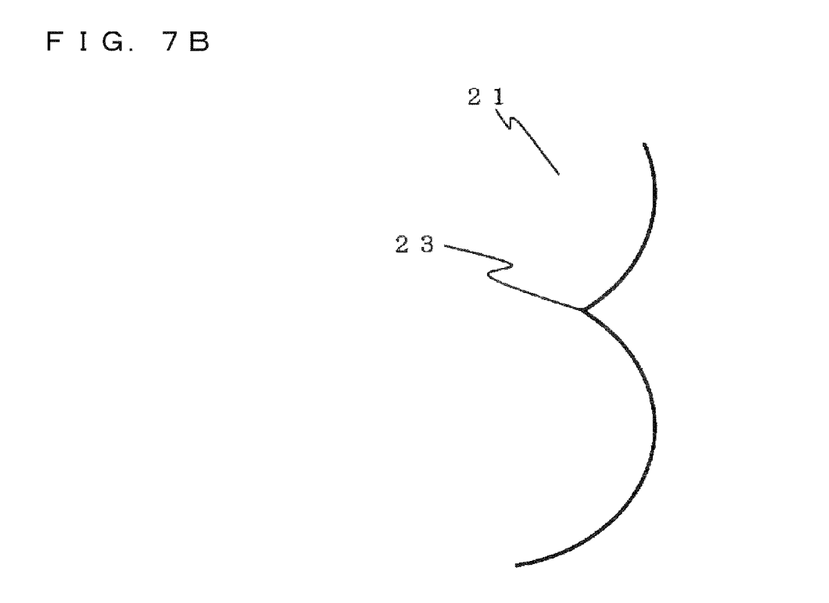
FIG. 7B is an enlarged view of the portion proximate to the projecting portion.
Figure 8A:
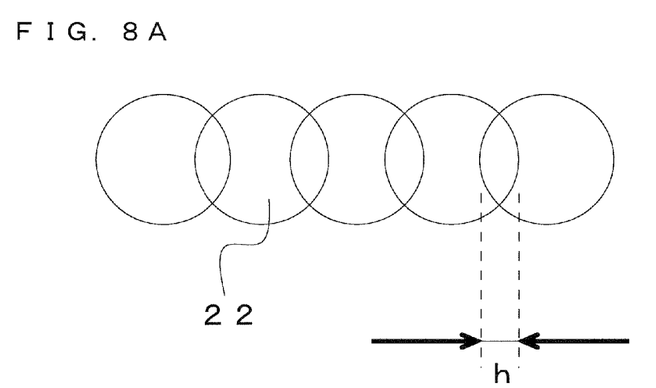
FIG. 8A is a plan view showing overlapping of laser spots.
Figure 8B:
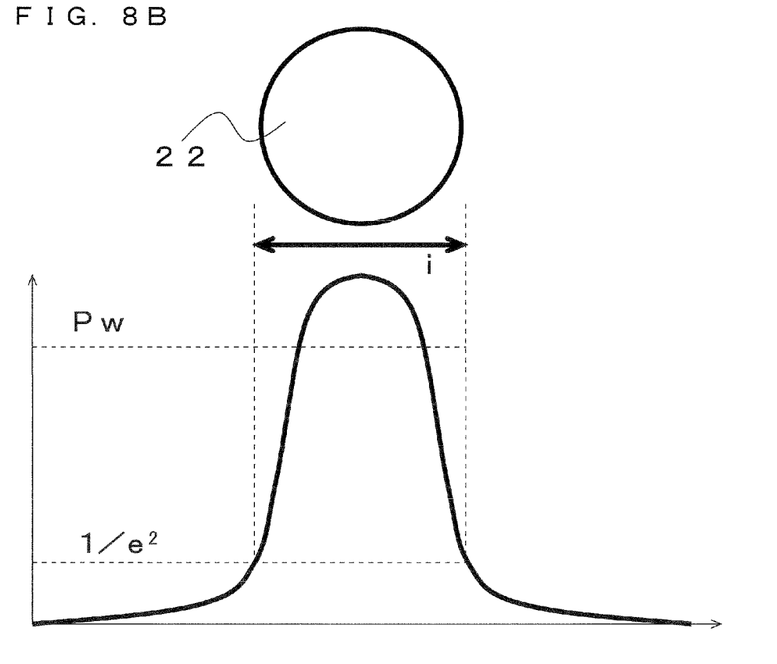
FIG. 8B shows a profile of the distribution of laser power.

FIG. 7A is a schematic view showing a separating groove 21 in plan view, which is formed by irradiating a back electrode 20 comprised of a metal thin film on a substrate with a laser beam, and FIG. 7B is a partially enlarged view of the separating groove 21. FIG. 8A is a schematic view showing a dimension of a portion in which laser spots 22 overlap one another, and FIG. 8B is a graph showing the distribution of power density of the laser spot 22, which shows the Gaussian distribution.

In laser processing shown in FIGS. 7A, 7B, 8A and 8B, normally, the spot in cross section perpendicular to the optical path of a laser emitted from a laser oscillator has an approximately circular shape. The back surface 20 is scanned while irradiating the laser to be pulsed, to thereby form the separating groove 21. Accordingly, as shown in FIG. 7A, the separating groove 21 has a shape in which portions of the laser spots 22 having an approximately circular shape overlap one another successively in a scanning direction. Therefore, the separating groove 21 includes sharp projecting portions 23 as shown in FIG. 7B. The projecting portion 23 is located at an intersection point of the laser spots 22 having an approximately circular shape and projects toward a gap of the separating groove 21.

In a case where a CIGS layer is formed on the back electrode 20 as described above, if stresses are induced due to a difference of thermal expansion coefficient between the metal thin film and the CIGS film, the stresses tend to be concentrated on the CIGS layer proximate to the portions immediately above the projecting portions 23. As a result, a fear arises that cracks may be caused in the CIGS layer disposed in the gap of the separating groove 21, starting from the CIGS layer located in proximity to the portions immediately above the projecting portions 23. When cracks are caused in the CIGS layer as described above, if moisture infiltrates into the crack portion from the outside, the back electrode 20 is electrically connected to the electrode comprised of a transparent conductive film via the moisture to generate a leakage current, which may decrease photoelectric conversion efficiency. In addition, a part of the CIGS layer degrades due to the existence of the moisture, and the CIGS layer peels off, which may decrease the reliability of a photoelectric conversion device.

Figure 9A:
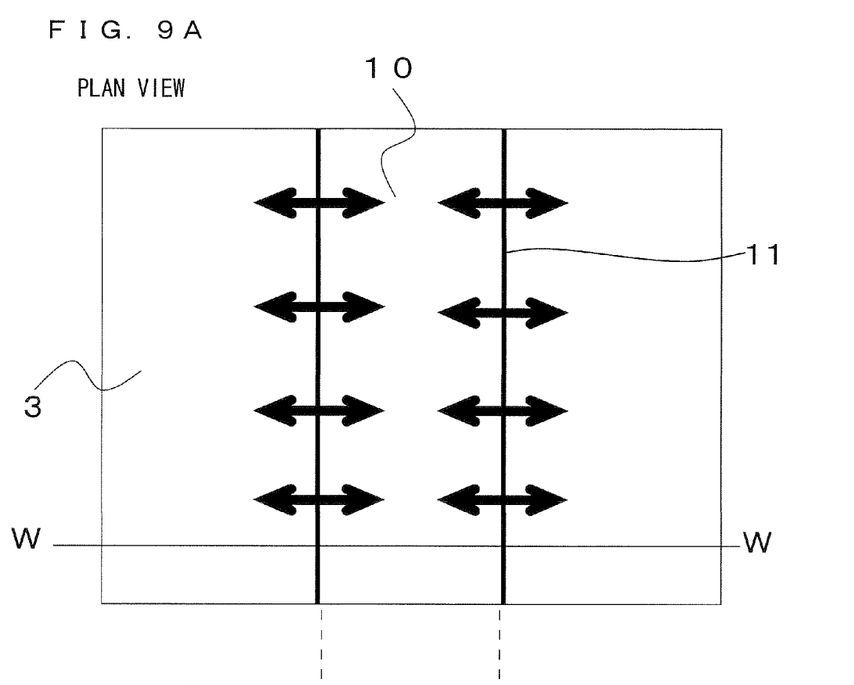
Figure 9B:
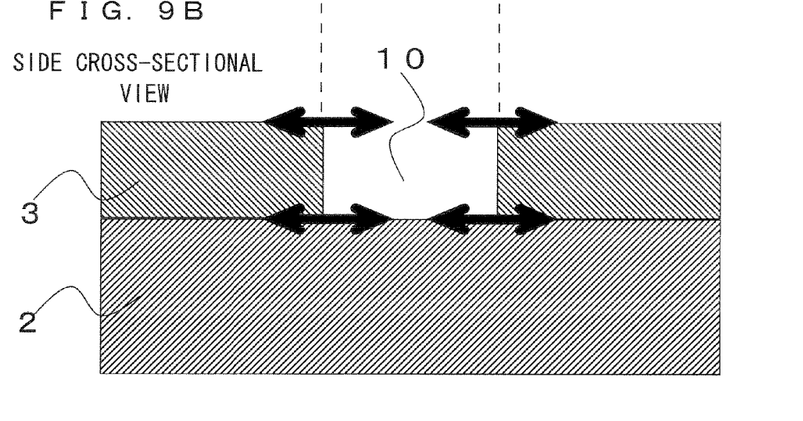

In a case where a gap 10 of a separating groove is linear (straight) as shown in FIG. 9, at times, it is highly likely that cracks are caused in a manner of propagating along an edge 11 of the separating groove.

An object of the present invention is to provide a photoelectric conversion device having high efficiency and high reliability by reducing cracks caused in a photoelectric conversion layer.

A photoelectric conversion device according to an embodiment of the present invention comprises a laminate in which a substrate, a pair of electrodes located on the substrate with a gap therebetween, and a photoelectric conversion layer located in the gap and on the pair of electrodes are laminated. Each of the pair of electrodes includes a linear portion extending along the gap and a first projecting portion including a curved tip surface projecting from the linear portion toward the gap, the linear portion and the first projecting portion being alternately arranged along the gap.

A method for manufacturing a photoelectric conversion device according to an embodiment of the present invention comprises forming an electrode layer on a substrate, separating the electrode layer with a laser beam to form a pair of electrodes with a gap therebetween, and forming a photoelectric conversion layer in the gap and on the pair of electrodes. In the separating, the electrode layer is repeatedly irradiated with laser beams including approximately rectangular spots while shifting the laser beams such that portions of the spots overlap one another.

According to the photoelectric conversion device of the embodiment of the present invention, the first projecting portion protruding toward the gap of the separating groove of the back electrode includes a curved tip surface. Accordingly, the concentration of stresses of the photoelectric conversion layer in the first projecting portion can be reduced, which reduces the crack occurrence in the first projecting portion.

In addition, stresses are dispersed by the curved tip surface of the first projecting portion, which can reduce cracks.

Further, according to the method for manufacturing a photoelectric conversion device of the embodiment of the present invention, the tip surface of the first projecting portion of the electrode, which projects toward the gap of the separating groove formed by separating the electrode layer, can be easily curved.

BRIEF DESCRIPTION OF THE DRAWINGS

FIGS. 5A and 5B are schematic views for showing parts corresponding to dimensions a to g, where FIG. 5A is a plan view of the separating groove formed in the back electrode and FIG. 5B is a cross-sectional view taken along a line Y-Y of FIG. 5A.

FIGS. 6A and 6B are schematic views for showing directions of stresses in the parts, where FIG. 6A is a plan view of the separating groove formed in the back electrode and FIG. 6B is a cross-sectional view taken along a line Z-Z of FIG. 6A.

FIGS. 9A and 9B are schematic views for showing directions of stresses in the parts, where FIG. 9A is a plan view of the separating groove formed in the back electrode and FIG. 9B is a cross-sectional view taken along a line W-W of FIG. 9A.

EMBODIMENT FOR CARRYING OUT THE INVENTION

A photoelectric conversion device according to an embodiment of the present invention and a method for manufacturing the same are described with reference to the drawings.

Figure 1:
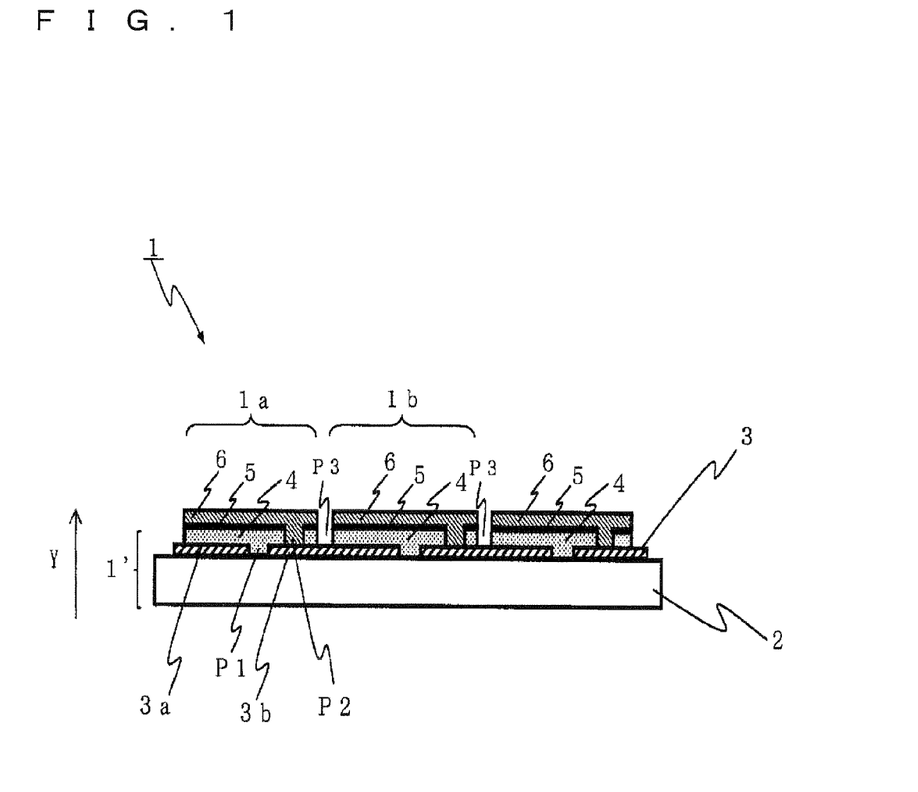
FIG. 1 is a cross-sectional view showing an example of the structure of a photoelectric conversion device according to an embodiment of the present invention.

As shown in FIG. 1, a photoelectric conversion device 1 according to the embodiment of the present invention includes a substrate 2, a back electrode 3 provided on the substrate 2, a photoelectric conversion layer 4 provided on the back electrode 3, a buffer layer 5 provided on the photoelectric conversion layer 4, and a window layer 6 corresponding to a front electrode. While the present embodiment describes the photoelectric conversion layer 4 comprised of a chalcopyrite-based compound and the buffer layer 5 forming a heterojunction to the photoelectric conversion layer 4 as different elements, the buffer layer 5 may be included in the photoelectric conversion layer 4. As shown in FIG. 1, the substrate 2, the back electrode 3, and the photoelectric conversion layer 4 constitute a laminate 1' in which they are laminated along a lamination direction Y.

The substrate 2 serves to support the back electrode 3, the photoelectric conversion layer 4, the buffer layer 5, and the window layer 6. For example, plate-like glass, ceramics, resins, and metals can be used for the above-mentioned substrate 2. A blue plate glass (soda-lime glass) having a thickness of approximately 1 to 3 mm is preferably used for the substrate 2 in terms of an improvement in photoelectric conversion efficiency, strength, and cost.

The back electrode 3 serves to collect carriers generated in the photoelectric conversion layer 4, the buffer layer 5, and the window layer 6. For example, a metal thin film comprised of molybdenum, titanium, tantalum, or the like having a thickness of approximately 0.2 to 1 μm, or a laminated structure of the above-mentioned metals is used for the above-mentioned back electrode 3. Examples of the method for forming the back electrode 3 include a sputtering method and a vapor-deposition process.

The photoelectric conversion layer 4 is a semiconductor that serves as a light-absorbing layer and has a p-type conductivity. The photoelectric conversion layer 4 is comprised of a chalcopyrite-based compound. For example, the photoelectric conversion layer 4 includes a chalcopyrite structure semiconductor thin film having a thickness of approximately 1 to 3 μm. Specifically, examples of the above-mentioned photoelectric conversion layer 4 include multinary compound semiconductor thin films of, for example, copper indium diselenide, copper indium gallium diselenide, copper indium gallium diselenide-disulfide, and copper indium gallium disulfide. Another example thereof is a multinary compound semiconductor thin film of, for example, copper indium gallium diselenide that includes a surface layer comprised of a thin film of copper indium gallium diselenide-disulfide layer. The photoelectric conversion layer 4 as described above is formed by, for example, a sputtering method, a vapor-deposition process, or a printing process.

The buffer layer 5 serves to form a heterojunction between the photoelectric conversion layer 4 and itself. A compound semiconductor such as cadmium sulfide (CdS), indium sulfide (InS), zinc sulfide (ZnS), or the like having a thickness of approximately 0.01 to 0.1 μm is used for the above-mentioned buffer layer 5. The above-mentioned buffer layer 5 is formed by, for example, a solution-growth process (CBD method).

The window layer 6 is a semiconductor having an n-type conductivity and serves to collect the carriers generated in the photoelectric conversion layer 4, the buffer layer 5, and the window layer 6. In the present embodiment, the back electrode 3 collects holes, and the window layer 6 collects electrons. Light enters from the window layer 6 side in the photoelectric conversion device 1, and thus, the window layer 6 is transparency to light. A compound semiconductor including zinc oxide (ZnO) and having a thickness of 1 to 2 μm, a compound semiconductor of zinc oxide including aluminum, boron, gallium, indium, flurine, or the like, or a compound semiconductor including indium oxide (ITO) containing tin or tin oxide ($SnO_2$) is used for the above-mentioned window layer 6. The above-mentioned window layer 6 is formed by, for example, a sputtering method, or a metal organic chemical vapor deposition method (MOCVD method). The window layer 6 also serves as one electrode (front electrode) in the photoelectric conversion device 1.

The photoelectric conversion device 1 may further include a transparent conductive film formed on the window layer 6 or include an electrode obtained by combining the window layer 6 and a transparent conductive film. Moreover, the photoelectric conversion device 1 may include a collector electrode that is formed on the transparent electrode film and is comprised of a material having a low resistance such as silver for enhancing the effect of collecting carriers.

The photoelectric conversion device 1 including the photoelectric conversion layer 4 comprised of a chalcopyrite-based compound as in the present embodiment needs to increase an output voltage further.

For that purpose, integration is performed by connecting a plurality of photoelectric conversion units in series within one photoelectric conversion device formed on the substrate 2.

Such an integration of the photoelectric conversion device is performed through steps described below.

First, a separating groove P1 for separating the back electrode 3 deposited on the substrate 2 into strips is formed. Subsequently, the photoelectric conversion layer 4 and the buffer layer 5 are formed on the substrate 2, the back electrode 3, and the separating groove P1. Then, a separating groove P2 for separating the photoelectric conversion layer 4 and the buffer layer 5 is formed at a position proximate to the separating groove P1. Finally, the window layer 6 (transparent conductive film electrode) is formed on the buffer layer 5, and a separating groove P3 for separating the window layer 6, the buffer layer 5, and the photoelectric conversion layer 4 is formed at a position proximate to the separating groove P2. In this manner, the photoelectric conversion device 1 is divided into a plurality of photoelectric conversion units (photoelectric conversion units 1a and photoelectric conversion units 1b) adjacent to each other. The photoelectric conversion units adjacent to each other via the separating groove P2 are connected in series. Specifically, the photoelectric conversion unit 1a and the photoelectric conversion unit 1b adjacent to each other are connected in series through electrical connection between the window layer 6 of the photoelectric conversion unit 1a and the back electrode 3 shared by the photoelectric conversion unit 1a and the photoelectric conversion unit 1b.

Figure 2A:
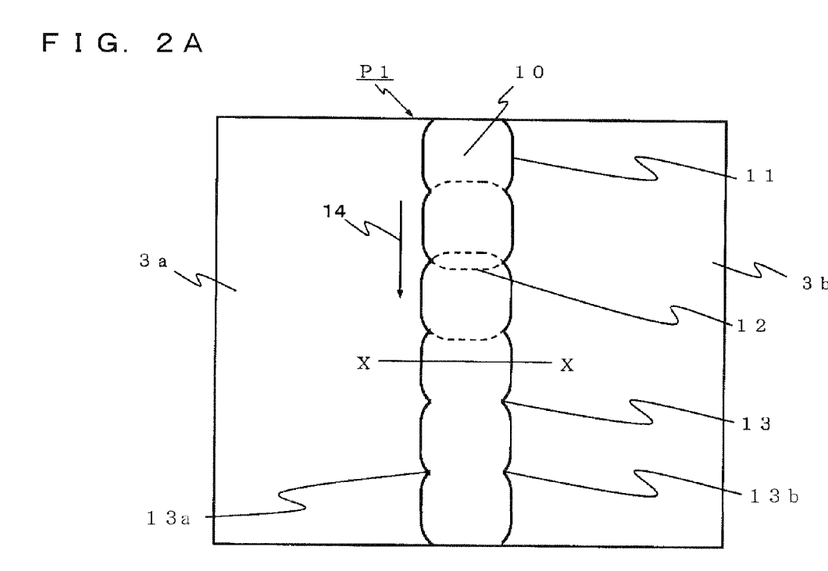
FIG. 2A is a plan view of a separating groove formed in a back electrode.

Next, the separating groove P1 formed in the integration of the above-mentioned photoelectric conversion device 1 is described in detail. FIG. 2A shows the state in which the separating groove P1 is formed in the back electrode 3.

The separating groove P1 is formed by irradiation of a laser beam. As a result of the formation of the separating groove P1 in the back electrode 3, the back electrode 3 is divided into a pair of back electrodes 3a and 3b that form a pair. In FIG. 2A showing the present embodiment, a gap arranged between the pair of back electrodes 3a and 3b in the separating groove P1 is a gap 10, and edges (edges of the back electrodes 3a and 3b) in the separating groove P1 are edges 11. In addition, in FIG. 2A, the spot shape of a laser beam is a laser spot 12, and the portions of the pair of back electrodes 3a and 3b, which project toward the gap 10, are first projecting portions 13a and 13b. Further, in FIG. 2A, the arrangement direction of the gap 10 is indicated by an arrow 14. The width of the gap 10 in the portion in which the first projection portion 13 does not exist is approximately 30 μm to 70 μm.

As described above, the photoelectric conversion device according to the present embodiment includes a laminate obtained by laminating a substrate, a pair of electrodes that are provided on the substrate and are arranged with a gap therebetween, and a photoelectric conversion layer provided in the gap and on the pair of electrodes. Each of the pair of electrodes includes linear portions along the gap and first projecting portions including a curved tip surface projecting from the linear portion toward the gap, which are arranged alternately along the gap.

That is, the tip surface of the first projecting portion 13 of the back electrode 3, which projects toward the gap 10 of the separating groove P1, is curved. Accordingly, the concentration of stresses of the photoelectric conversion layer 4 in the first projecting portion 13 is reduced, which reduces crack occurrence in the first projecting portion 13.

Stresses are dispersed by the curved tip surface of the first projecting portion 13, which reduces the propagation of cracks along the edges 11 of the separating groove P1.

Figure 2B:
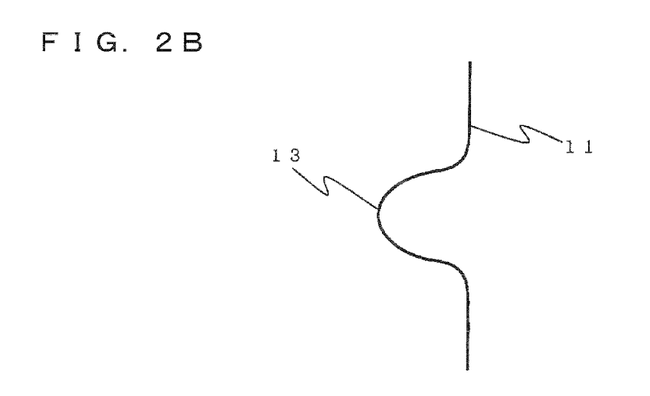
FIG. 2B is an enlarged view of a portion proximate to a first projecting portion of the back electrode.

In the photoelectric conversion device 1 according to the present embodiment, as shown in FIG. 2B, the tip surface of the first projecting portion 13 projecting toward the gap 10 between the pair of back electrodes 3a and 3b is curved. That is, in the present embodiment, the tip surface of the first projecting portion 13 opposed to the gap 10 is curved. Therefore, in a case where the photoelectric conversion layer 4 is formed on the back electrodes 3a and 3b in the step later, even if stresses are induced due to a difference of thermal expansion coefficient between the back electrodes 3a and 3b and the photoelectric conversion layer 4, the stresses acting on the photoelectric conversion layer 4 proximate to the first projecting portion 13 of the separating groove P1 can be dispersed. Accordingly, the concentration of stresses in specific spots can be reduced, which can reduce the cracks generated in the photoelectric conversion layer 4 arranged in the gap 10 of the separating groove P1, starting from the first projecting portion 13. The method for forming the first projecting portions 13a and 13b including a curved tip surface as described above is described below. Alternatively, not only the tip surface of the first projecting portion 13 that is opposed to the gap 10 of the separating groove P1, but also the outer peripheral surface thereof other than the tip surface may be curved. In this case, the effect of reducing the concentration of stresses can be enhanced further.

Further, in the present embodiment, a plurality of first projecting portions may be formed at constant intervals along the gap.

Figure 6A:
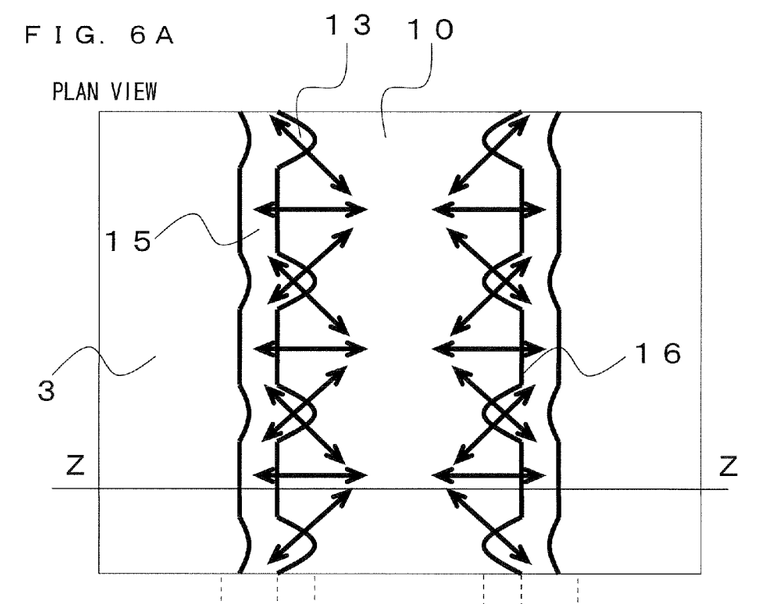
Figure 6B:
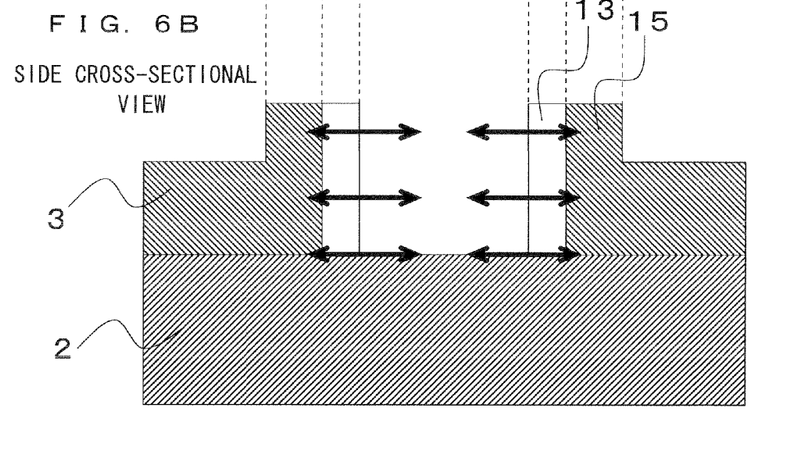

Accordingly, the stresses at the edges 11 of the separating groove P1 can be dispersed and relieved at the first projecting portions 13, as shown in FIG. 6A and FIG. 6B.

Further, in the present embodiment, the first projecting portions respectively provided in a pair of electrodes may be opposed to each other.

This enables cracks to propagate in the shortest distance between the first projecting portions 13 respectively provided in the pair of electrodes, and thus, the generation of a large amount of leakage current can be reduced.

That is, as shown in FIG. 2A, the first projecting portions 13a and 13b of the pair of back electrodes 3a and 3b may be provided so as to be opposed to each other at the edges 11 of the separating groove P1 on the both sides of the gap 10 along the arrangement direction 14. In such a form, even if large stresses act on the first projecting portions 13a and 13b, a crack that links the first projecting portion 13a and the first projecting portion 13b is more likely to be guided because the first projecting portion 13a and the first projecting portion 13b are located at positions relatively close to each other. That is, the generation of the cracks that link the back electrode 3 and the window layer 6 can be reduced by guiding the above-mentioned cracks formed in the gap 10. In other words, in such a form, the generation of cracks that are likely to affect characteristics of the photoelectric conversion device 1 can be reduced by generating cracks that are unlikely to affect the characteristics of the photoelectric conversion device 1.

Figure 4:
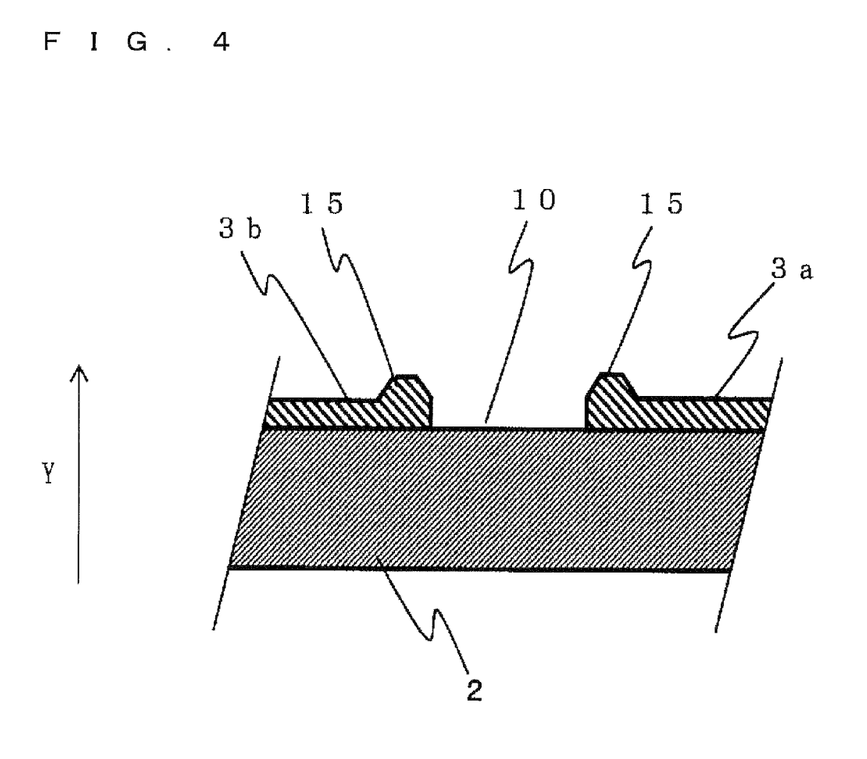
FIG. 4 is a cross-sectional view taken along a line X-X of FIG. 2A.

Further, in the present embodiment, as shown in FIG. 4, the pair of electrodes may respectively include, at the edges opposed to each other, second projecting portions 15 that project continuously along the arrangement direction of a gap in the lamination direction of the laminate.

Accordingly, the stresses can be dispersed also in the thickness direction of the back electrode 3, which can further reduce the concentration of stresses. That is, as shown in FIG. 4, second projecting portions 15 that are continuous along the arrangement direction of the gap 10 and project toward the lamination direction Y may be formed at the edges 11 in which the pair of back electrodes 3 are opposed to each other. The second projecting portion 15 is formed so as to enter the photoelectric conversion layer 4. According to the above-mentioned form, the second projecting portion 15 that is a part of the back electrode 3 enters the photoelectric conversion layer 4, which can enhance the adhesive strength between the back electrode 3 and the photoelectric conversion layer 4. This can result in a reduction of peel-off of the back electrode 3 and the photoelectric conversion layer 4.

A height f of the second projecting portion 15 from the upper surface of the back electrode 3 can be set to 0.2 μm or larger and 1.4 μm or smaller. That is, when the height f of the second projecting portion 15 from the upper surface of the back electrode 3 is 0.2 μm or larger, the effect of reducing peel-off of the metal thin film forming the back electrode 3 is sufficiently obtained. When the height f of the second projecting portion 15 from the upper surface of the back electrode 3 is 1.4 μm or smaller, it is possible to reduce an increase in the leakage current of the finished photoelectric conversion device 1 caused by a decrease in the distance between the back electrode 3 and the window layer 6. The second projecting portion 15 is provided in the lamination direction Y such that the height f of the second projecting portion 15 is smaller than the thickness of the photoelectric conversion layer 4.

Further, in the present embodiment, the relationship between a projecting length a of the first projecting portion 13 and a curvature b of the tip surface may be such that a/b=0.33 to 1.

This can reduce ease of crack occurrence caused by an extremely small curvature b of the tip surface with respect to the projecting length a of the first projecting portion 13 and can also reduce insufficient dispersion of stresses caused by an extremely large curvature b of the tip surface.

Further, in the present embodiment, the relationship between a width c of the first projecting portion 13 and a length d of the linear portion may be such that c/d=0.23 to 0.8.

This can secure the first projecting portions 13 that disperse the stresses as needed and can also reduce an increase of unnecessary spots in which stresses are concentrated.

Further, in the present embodiment, the relationship between a width e of the gap 10 and the projecting length a of the first projecting portion 13 may be such that e/a=15 to 50.

This enables to obtain an appropriate projecting length a of the first projecting portion 13 matching the width e of the gap 10 of the separating groove P1. That is, this makes it easy to minimize the distance of the propagation of cracks between the first projecting portions 13 and can also reduce an electrical short-circuit between the first projecting portions 13.

Further, in the present embodiment, the relationship between the width e of the gap 10 and the length d of the linear portion may be such that e/d=1.4 to 5.

This enables to obtain an appropriate length d of the linear portion matching the width e of the gap 10 of the separating groove P1. That is, this makes it easy to minimize the distance of the propagation of cracks between the first projecting portions 13 and can also reduce an electrical short-circuit of the first projecting portions 13.

Further, in the present embodiment, the relationship between the projecting length f of the second projecting portion 15 and a thickness g of the back electrode 3 may be such that f/g=0.3 to 3.5.

This enables to preferably match the projecting length f of the second projecting portion 15 with the thickness of the back electrode 3. That is, the stresses due to the expansion and contraction of the back electrode 3 can be dispersed in the lamination direction. In addition, it is possible to reduce an occurrence of a leakage current caused by the second projecting portion 15 reaching the buffer layer 5.

Next, the method for manufacturing a photoelectric conversion device according to the embodiment of the present invention is described.

The present embodiment comprises a step of forming an electrode layer on a substrate, a laser separation step of separating the electrode layer with a laser beam to form a pair of electrodes with a gap therebetween, and a step of forming a photoelectric conversion layer in the gap and on the pair of electrodes, where in the laser separation step, the electrode layer is repeatedly irradiated with laser beams having approximately rectangular spots while shifting the laser beams such that portions of the spots overlap one another.

Hereinafter, each of the steps is described specifically.

First, an electrode layer made of molybdenum is formed as the back electrode 3 on an approximately entire surface of the substrate 2 subjected to ultrasonic washing with pure water or the like by, for example, a sputtering method.

Then, a separating groove is formed in the electrode layer with a laser beam to pattern the back electrode 3. In this laser separation step, the back electrode 3 is repeatedly irradiated with laser beams while shifting the laser beams having approximately rectangular spots such that portions of the spots overlap one another.

In this laser separation step, used as the laser beam used in patterning of the back electrode 3 may be one having the laser spot 12 of an approximately rectangular shape in cross section perpendicular to the optical path of the laser beam emitted from a laser oscillator as shown in FIG. 2A. In the present embodiment, the back electrode 3 is repeatedly irradiated with the laser beams having the laser spots 12 of an approximately rectangular shape while shifting the laser beams such that the laser spots 12 overlap one another and, simultaneously, the electrode layer is scanned, to thereby form the gap 10 of the separating groove.

The shape of the edge 11 of the separating groove P1 that is formed in the above-mentioned laser separation step is smoother compared with a case where the laser spot 12 has a circular shape. In addition, the first projecting portion 13 positioned at the intersection point of the laser spot 12 and its adjacent spot includes a curved tip portion due to a thermal effect by laser irradiation.

The back electrode 3 is repeatedly irradiated with the laser beams having the approximately rectangular laser spots 12 while shifting the laser beams such that the laser spots 12 overlap one another, whereby the first projecting portions 13a and 13b of the pair of back electrodes 3a and 3b are provided to be opposed to each other. This enables to provide the second projecting portions 15 in a sequential manner along the arrangement direction of the gap 10 by thermal effects due to laser irradiation.

Note that the laser beam may show top-hat energy distribution in the present embodiment.

The laser beam showing the top-hat energy distribution makes the thermal energy applied to the substrate and the electrode layer approximately uniform. This can reduce, for example, cracks in the substrate and alteration of the electrode layer which occur due to the unevenness of thermal energy.

Further, in the present embodiment, the overlap rate referring to overlapping of portions of the laser spots may be 5 to 15%.

Figure 5A:
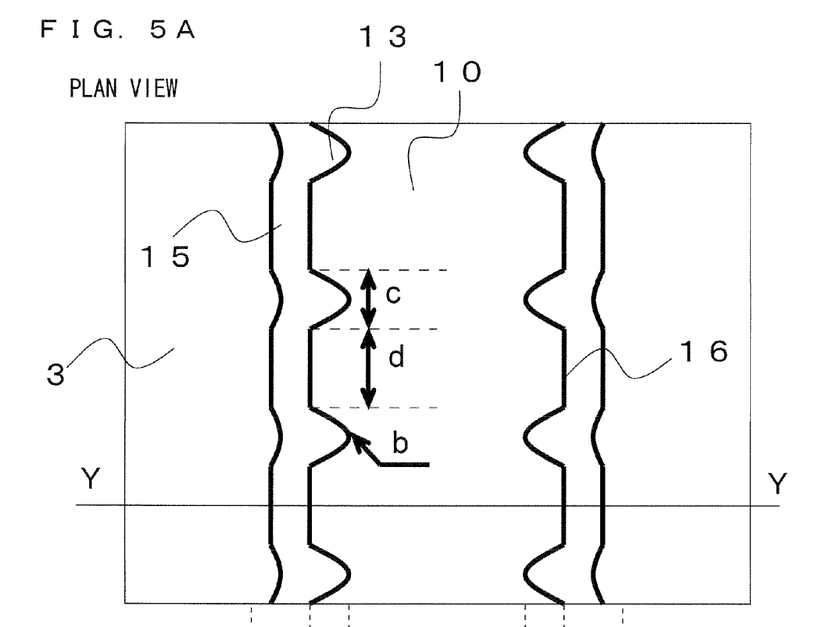
Figure 5B:
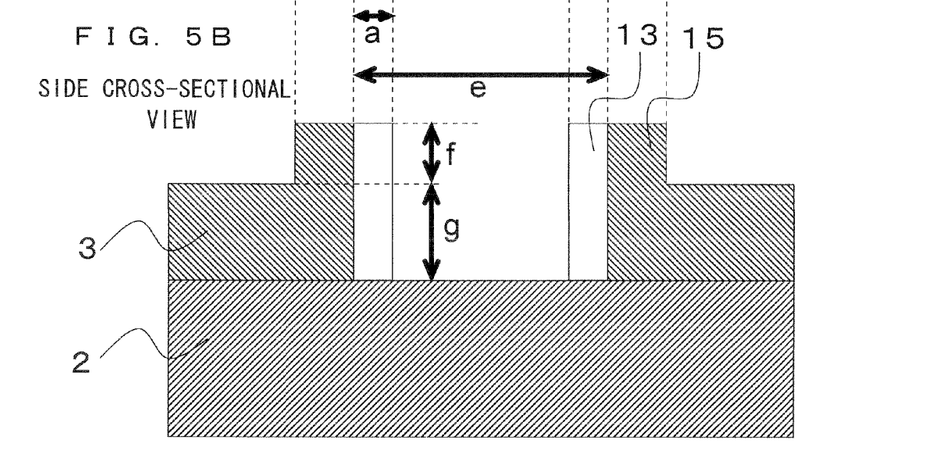

This can reduce, as shown in FIGS. 5A and 5B, an excessively enlargement of the projecting length a of the first projecting portion 13, an excessive enlargement of the curvature b of the tip surface, an excessive enlargement of the width c of the first projecting portion 13, and an excessive enlargement of the length of the linear portion 16, due to an excessively small overlap rate h/i.

In addition, this can reduce an excessive reduction of the projecting length a of the first projecting portion 13, an excessive reduction of the curvature b of the tip surface, an excessive reduction of the width c of the first projecting portion 13, and an excessive reduction of the length of the linear portion 16, due to an excessively large overlap rate h/i.

Further, it is possible to reduce peel-off caused by damage to the back electrode 3 due to an excessively large overlap rate.

Figure 3A:
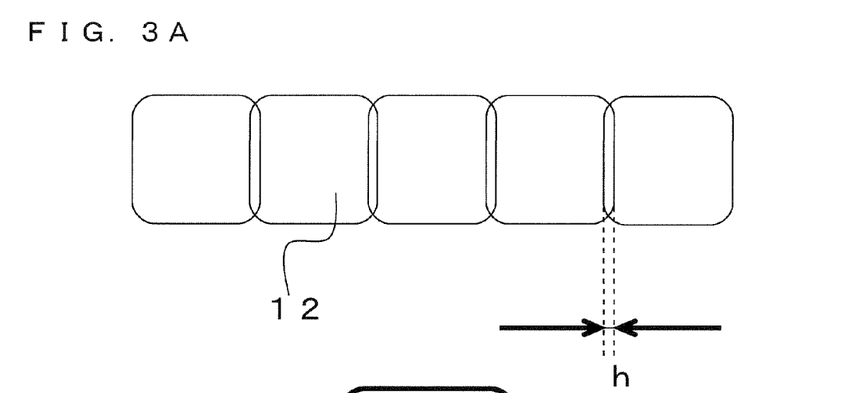
FIG. 3A is a plan view showing overlapping of laser spots.
Figure 3B:
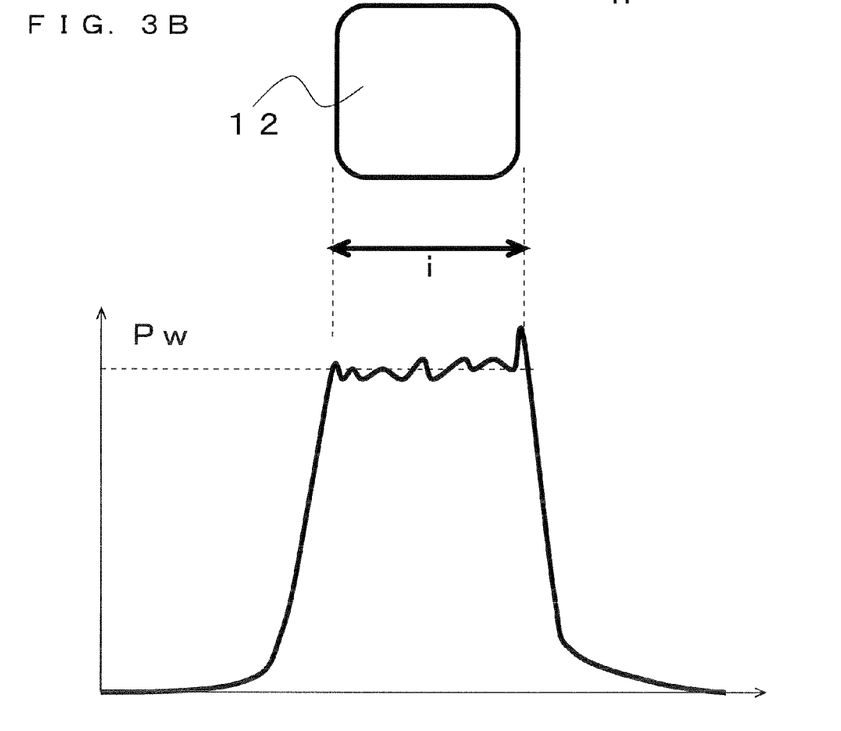
FIG. 3B shows a profile of the distribution of laser power.

Note that as shown in FIG. 3A and FIG. 3B, the overlap rate herein is expressed by h/i given that the width of overlapping of the laser sports 12 is represented by h and the diameter of a laser spot is represented by i.

Then, the photoelectric conversion layer 4 comprised of a chalcopyrite-based compound is formed on the back electrode 3 by a sputtering method, a vapor-deposition process, a printing process, or the like. In the manufacturing method of the present embodiment, particularly in the step of forming the photoelectric conversion layer 4, the photoelectric conversion layer 4 may be formed by a heat treatment after the application of a paste containing a feedstock of the chalcopyrite-based photoelectric conversion layer 4. That is, in the present embodiment, in the step of forming the photoelectric conversion layer 4, a paste containing a feedstock of the chalcopyrite-based photoelectric conversion layer 4 is applied in the gap 10 and onto the pair back of electrodes 3a and 3b to form a coating serving as the photoelectric conversion layer, and then, the coating is subjected to a heat treatment.

In the case where the heat treatment is required in the formation of the photoelectric conversion layer 4, the chalcopyrite-based photoelectric conversion layer 4 tends to contract due to a heat, which tends to cause cracks in the photoelectric conversion layer 4. In the present embodiment, however, the first projecting portions 13a and 13b formed on the back electrode 3 include curved tip surface s as described above, and thus, the crack occurrence described above can be reduced even if the above-mentioned thermal contraction occurs.

Examples of the method for forming the photoelectric conversion layer 4 that includes the above-mentioned thermal treatment step include the method of applying a paste containing a feedstock of the chalcopyrite-based photoelectric conversion layer 4 by a spin coating method or a screen printing method and firing the paste for approximately 40 minutes to 90 minutes at a temperature of approximately 450° C. to 600° C.

The paste containing a feedstock of the chalcopyrite-based photoelectric conversion layer 4 is prepared by adding powders of a selenium compound of at least one type of indium and germanium or powders of a sulfide to an organic solvent of toluene or acetone in which a single precursor is dissolved, and then dissolving or mixing those.

Examples of the single precursor herein include one containing at least one type of copper (Cu), sulfur (S), and selenium (Se) and at least one type of indium (In) and germanium (Ge).

Next, the buffer layer 5 is formed on the photoelectric conversion layer 4 by, for example, a solution-growth process (CBD method). The separating groove P2 is formed by mechanical scribing, to thereby pattern the photoelectric conversion layer 4 comprised of a chalcopyrite-based compound that has been deposited on an approximately entire surface of the back electrode 3 and the buffer layer 5.

Then, the window layer 6 is formed on an approximately entire surface of the buffer layer 5 by a sputtering method, a metal organic chemical vapor deposition (MOCVD method), or the like, and the separating groove P3 is formed by mechanical scribing, to thereby pattern the window layer 6. As a result, the photoelectric conversion device 1 is formed.

EXAMPLES

Production of Sample

A blue plate glass (soda-lime glass) having a thickness of 1 mm was used as the substrate 2, and a metal thin film of molybdenum having a thickness of 1 μm, which has been formed by sputtering, was used as the back electrode 3.

In Example, a top-hat beam was used in the formation of the separating groove P1 in the back electrode 3. As specific conditions of the top-hat beam, the spot diameter i was changed between 10 and 70 μm, and the overlap width h was changed between 1 and 70 μm. On this occasion, the overlap rate h/i was controlled between 3 and 20%. In Comparative Example, the separating groove P1 was formed with a Gaussian beam.

Though not shown in Table 1, an adjustment was made whenever necessary such that the laser frequency would be 25 to 100 KHz, the pulse width would be 15 to 200 ns, and the power density would be $10^4$ to $10^5$ W/cm$^2$, to thereby produce samples 1 to 36 having the dimension values a to g shown in Table 1.

The samples 1 to 35 were produced with top-hat beams on various conditions, where the samples 3, 8, 13, 18, 23, 28, and 33 are standard samples on the same conditions.

The sample 36 is a comparative example produced with a Gaussian beam.

As to each of the samples, the separating groove P1 was formed, and then, the photoelectric conversion layer 4 was formed. Used as the method for forming the photoelectric conversion layer 4 in this case was the method of applying a paste containing a feedstock of the chalcopyrite-based photoelectric conversion layer 4 by a spin coating method, and firing the paste for approximately 40 minutes at a temperature of approximately 450° C. The paste containing a feedstock of the chalcopyrite-based photoelectric conversion layer 4 used in this case was produced by adding powders of a selenium compound of indium and germanium and powders of a sulfide to toluene in which a precursor containing copper (Cu), sulfur (S), selenium (Se), indium (In), and germanium (Ge) was dissolved, and dissolving those.

Next, the buffer layer 5 was formed by a solution-growth process (CBD method). Then, the separating groove P2 was formed by mechanical scribing, to thereby pattern the photoelectric conversion layer 4 comprised of a chalcopyrite-based compound formed on an approximately entire surface of the back electrode 3 and the buffer layer 5. Then, the window layer 6 was formed on an approximately entire surface of the buffer layer 5 by a sputtering method, and the separating groove P3 was formed by mechanical scribing, to thereby pattern the window layer 6. Accordingly, the photoelectric conversion device 1 was formed.

(Evaluation of Samples)

The photoelectric conversion units 1a and 1b shown in FIG. 1 were manufactured with the photoelectric conversion devices 1 of those samples, and then, the photoelectric conversion efficiency was evaluated.

Table 1 shows the results thereof.

TABLE 1

| | a μm | b μm | c μm | d μm | e μm | f μm | g μm | a/b | c/d | e/a | e/d | f/g | h μm | i μm | h/i % | conversion efficiency % | |
|---|---|---|---|---|---|---|---|---|---|---|---|---|---|---|---|---|---|
| 1 | 0.5 | 4 | 8 | 15 | 50 | 0.7 | 0.6 | 0.13 | 0.53 | 100 | 3.3 | 1.2 | 8 | 40 | 20 | 12 | |
| 2 | 1 | 4 | 8 | 15 | 50 | 0.7 | 0.6 | 0.25 | 0.53 | 50 | 3.3 | 1.2 | 6 | 40 | 15 | 14 | |
| s 3 | 2 | 4 | 8 | 15 | 50 | 0.7 | 0.6 | 0.50 | 0.53 | 25 | 3.3 | 1.2 | 4 | 40 | 10 | 15 | |
| 4 | 3 | 4 | 8 | 15 | 50 | 0.7 | 0.6 | 0.75 | 0.53 | 16.7 | 3.3 | 1.2 | 2 | 40 | 5 | 14 | |
| 5 | 4 | 4 | 8 | 15 | 50 | 0.7 | 0.6 | 1.00 | 0.53 | 12.5 | 3.3 | 1.2 | 1 | 40 | 3 | 12 | |
| 6 | 2 | 1 | 8 | 15 | 50 | 0.7 | 0.6 | 2.00 | 0.53 | 25 | 3.3 | 1.2 | 4 | 40 | 10 | 12 | |
| 7 | 2 | 2 | 8 | 15 | 50 | 0.7 | 0.6 | 1.00 | 0.53 | 25 | 3.3 | 1.2 | 4 | 40 | 10 | 14 | |
| s 8 | 2 | 4 | 8 | 15 | 50 | 0.7 | 0.6 | 0.50 | 0.53 | 25 | 3.3 | 1.2 | 4 | 40 | 10 | 15 | |
| 9 | 2 | 6 | 8 | 15 | 50 | 0.7 | 0.6 | 0.33 | 0.53 | 25 | 3.3 | 1.2 | 4 | 40 | 10 | 14 | |
| 10 | 2 | 7 | 8 | 15 | 50 | 0.7 | 0.6 | 0.29 | 0.53 | 25 | 3.3 | 1.2 | 4 | 40 | 10 | 12 | |
| 11 | 2 | 4 | 3 | 15 | 50 | 0.7 | 0.6 | 0.50 | 0.2 | 25 | 3.3 | 1.2 | 8 | 40 | 20 | 12 | |
| 12 | 2 | 4 | 4 | 15 | 50 | 0.7 | 0.6 | 0.50 | 0.27 | 25 | 3.3 | 1.2 | 6 | 40 | 15 | 14 | |
| s 13 | 2 | 4 | 8 | 15 | 50 | 0.7 | 0.6 | 0.50 | 0.53 | 25 | 3.3 | 1.2 | 4 | 40 | 10 | 15 | |
| 14 | 2 | 4 | 12 | 15 | 50 | 0.7 | 0.6 | 0.50 | 0.8 | 25 | 3.3 | 1.2 | 2 | 40 | 5 | 14 | |
| 15 | 2 | 4 | 13 | 15 | 50 | 0.7 | 0.6 | 0.50 | 0.87 | 25 | 3.3 | 1.2 | 1 | 40 | 3 | 12 | |
| 16 | 2 | 4 | 8 | 9 | 50 | 0.7 | 0.6 | 0.50 | 0.89 | 25 | 5.6 | 1.2 | 4 | 40 | 10 | 12 | |
| 17 | 2 | 4 | 8 | 10 | 50 | 0.7 | 0.6 | 0.50 | 0.8 | 25 | 5 | 1.2 | 4 | 40 | 10 | 14 | |
| s 18 | 2 | 4 | 8 | 15 | 50 | 0.7 | 0.6 | 0.50 | 0.53 | 25 | 3.3 | 1.2 | 4 | 40 | 10 | 15 | |
| 19 | 2 | 4 | 8 | 35 | 50 | 0.7 | 0.6 | 0.50 | 0.23 | 25 | 1.4 | 1.2 | 4 | 40 | 10 | 14 | |
| 20 | 2 | 4 | 8 | 40 | 50 | 0.7 | 0.6 | 0.50 | 0.2 | 25 | 1.3 | 1.2 | 4 | 40 | 10 | 12 | |
| 21 | 2 | 4 | 8 | 15 | 20 | 0.7 | 0.6 | 0.50 | 0.53 | 10 | 1.3 | 1.2 | 1 | 10 | 10 | 12 | |
| 22 | 2 | 4 | 8 | 15 | 30 | 0.7 | 0.6 | 0.50 | 0.53 | 15 | 2 | 1.2 | 2 | 20 | 10 | 14 | |
| s 23 | 2 | 4 | 8 | 15 | 50 | 0.7 | 0.6 | 0.50 | 0.53 | 25 | 3.3 | 1.2 | 4 | 40 | 10 | 15 | |
| 24 | 2 | 4 | 8 | 15 | 70 | 0.7 | 0.6 | 0.50 | 0.53 | 35 | 4.7 | 1.2 | 60 | 60 | 10 | 14 | |
| 25 | 2 | 4 | 8 | 15 | 80 | 0.7 | 0.6 | 0.50 | 0.53 | 40 | 5.3 | 1.2 | 70 | 70 | 10 | 12 | |
| 26 | 2 | 4 | 8 | 15 | 50 | 0.1 | 0.6 | 0.50 | 0.53 | 25 | 3.3 | 0.2 | 4 | 40 | 10 | 12 | |
| 27 | 2 | 4 | 8 | 15 | 50 | 0.2 | 0.6 | 0.50 | 0.53 | 25 | 3.3 | 0.3 | 4 | 40 | 10 | 14 | |
| s 28 | 2 | 4 | 8 | 15 | 50 | 0.7 | 0.6 | 0.50 | 0.53 | 25 | 3.3 | 1.2 | 4 | 40 | 10 | 15 | |
| 29 | 2 | 4 | 8 | 15 | 50 | 1.4 | 0.6 | 0.50 | 0.53 | 25 | 3.3 | 2.3 | 4 | 40 | 10 | 14 | |
| 30 | 2 | 4 | 8 | 15 | 50 | 1.5 | 0.6 | 0.50 | 0.53 | 25 | 3.3 | 2.5 | 4 | 40 | 10 | 12 | |
| 31 | 2 | 4 | 8 | 15 | 50 | 0.7 | 0.1 | 0.50 | 0.53 | 25 | 3.3 | 7 | 4 | 40 | 10 | 12 | |
| 32 | 2 | 4 | 8 | 15 | 50 | 0.7 | 0.2 | 0.50 | 0.53 | 25 | 3.3 | 3.5 | 4 | 40 | 10 | 14 | |
| s 33 | 2 | 4 | 8 | 15 | 50 | 0.7 | 0.6 | 0.50 | 0.53 | 25 | 3.3 | 1.2 | 4 | 40 | 10 | 15 | |
| 34 | 2 | 4 | 8 | 15 | 50 | 0.7 | 1 | 0.50 | 0.53 | 25 | 3.3 | 0.7 | 4 | 40 | 10 | 14 | |
| 35 | 2 | 4 | 8 | 15 | 50 | 0.7 | 1.1 | 0.50 | 0.53 | 25 | 3.3 | 0.6 | 4 | 40 | 10 | 12 | |
| 36 | — | — | — | — | 50 | — | 0.6 | — | — | — | — | — | 4 | 40 | 10 | 9 | Gaussian | s refers to the same conditions

It is revealed that the preferable relationship between the projecting length a of the first projecting portion and the curvature b of the tip surface is such that a/b=0.33 to 1 from the samples 1 to 10.

It is revealed that the preferable relationship between the width c of the first projecting portion and the length d of the linear portion is such that c/d=0.23 to 0.8 from the samples 11 to 20.

It is revealed that the preferable relationship between the width e of the gap and the projecting length a of the first projecting portion is such that e/a=15 to 50 from the samples 1 to 5 and the samples 21 to 25.

It is revealed that the preferable relationship between the width e of the gap and the length d of the linear portion is such that e/d=1.4 to 5 from the samples 16 to 25.

It is revealed that the preferable relationship between the projecting length f of the second projecting portion and the thickness g of the electrode is such that f/g=0.3 to 3.5 from the samples 26 to 35.

It is revealed that the overlap rate h/i is preferably controlled between 5 and 15% from the samples 1 to 5 and the samples 11 to 15.

The sample 36 was manufactured with a Gaussian beam, and it was confirmed that in the sample 36, cracks occurred starting from the sharp projecting portions 23 as shown in FIG. 7A and FIG. 7B and the conversion efficiency degraded due to a leakage current.

DESCRIPTION OF REFERENCE SYMBOLS

1; photoelectric conversion device
1'; laminate
1a, 1b; photoelectric conversion unit
2; substrate
3, 3a, 3b; back electrode
4; photoelectric conversion layer
5; buffer layer
6; window layer
10; gap of separating groove
11; edge of separating groove (back electrode)
12; laser spot
13, 13a, 13b; first projecting portion
14; arrangement direction of gap
15; second projecting portion
16; linear portion
a; projecting length of first projecting portion
b; curvature of tip surface
c; width of first projecting portion
d; length of linear portion
e; width of gap
f; projecting length of second projecting portion
g; thickness of electrode
h; overlap width
i; spot diameter

The invention claimed is:
1. A photoelectric conversion device, comprising a laminate in which a substrate, a pair of electrodes located on the substrate with a gap therebetween, and a photoelectric conversion layer located in the gap and on the pair of electrodes are laminated, wherein each of the pair of electrodes includes a linear portion extending along the gap and a first projecting portion including a curved tip surface projecting from the linear portion toward the gap, the linear portion and the first projecting portion being alternately arranged along the gap.

2. The photoelectric conversion device according to claim 1, wherein a plurality of the first projecting portions are formed at constant intervals along the gap.

3. The photoelectric conversion device according to claim 1, wherein the first projecting portions of the pair of electrodes are opposed to each other.

4. The photoelectric conversion device according to claim 1, wherein the pair of electrodes respectively include, at edges opposed to each other, second projecting portions provided continuously along an arrangement direction of the gap and protruded in a lamination direction of the laminate.

5. The photoelectric conversion device according to claim 1, wherein the relationship between a projecting length a of the first projecting portion and a curvature b of the tip surface is such that a/b=0.33 to 1.

6. The photoelectric conversion device according to claim 1, wherein the relationship between a width c of the first projecting portion and a length d of the linear portion is such that c/d=0.23 to 0.8.

7. The photoelectric conversion device according to claim 1, wherein the relationship between a width e of the gap and the projecting length a of the first projecting portion is such that e/a=15 to 50.

8. The photoelectric conversion device according to claim 1, wherein the relationship between the width e of the gap and the length d of the linear portion is such that e/d=1.4 to 5.

9. The photoelectric conversion device according to claim 4, wherein the relationship between a projecting length f of the second projecting portion and a thickness g of the electrode is such that f/g=0.3 to 3.5.

* * * * *